United States Patent
Hu (12)

(10) Patent No.: US 9,072,187 B2
(45) Date of Patent: Jun. 30, 2015

(54) OFF-PLANE CONDUCTIVE LINE INTERCONNECTS IN MICROELECTRONIC DEVICES

(75) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 13/601,704

(22) Filed: Aug. 31, 2012

(65) Prior Publication Data

US 2014/0063761 A1    Mar. 6, 2014

(51) Int. Cl.
*H05K 1/11* (2006.01)
*H05K 3/10* (2006.01)

(52) U.S. Cl.
CPC ............. *H05K 1/11* (2013.01); *Y10T 29/49162* (2015.01); *H05K 3/10* (2013.01)

(58) Field of Classification Search
CPC ............. H05K 1/11; H05K 3/10; H05K 7/06; H05K 3/107; H05K 3/1258; H05K 3/465
USPC ....................... 361/760; 174/266, 262; 29/850
See application file for complete search history.

(56) References Cited

U.S. PATENT DOCUMENTS

| | | | | |
|---|---|---|---|---|
| 6,967,152 B1 * | 11/2005 | Jordan et al. | | 438/597 |
| 2004/0126547 A1 * | 7/2004 | Coomer | | 428/209 |
| 2011/0254155 A1 * | 10/2011 | Lin et al. | | 257/737 |
| 2013/0122659 A1 * | 5/2013 | Wu et al. | | 438/126 |
| 2013/0252429 A1 * | 9/2013 | Okamoto et al. | | 438/696 |

* cited by examiner

*Primary Examiner* — Timothy Thompson
*Assistant Examiner* — Charles Pizzuto
(74) *Attorney, Agent, or Firm* — Blakely, Sokoloff, Taylor & Zafman LLP (57) ABSTRACT

Off-plane conductive line interconnects may be formed in microelectronic devices. In one example, such as device includes a first set of metal conductive lines in a dielectric substrate at a first horizontal layer of the substrate, a second set of metal conductive lines in the substrate at the first horizontal layer of the substrate and vertically offset from the first set of metal lines, and a dielectric material insulating the metal lines from each other and the first horizontal layer from other horizontal layers. Vias in the dielectric material to connect both the first and second set of metal lines to metal lines at a second horizontal layer of the substrate.

16 Claims, 7 Drawing Sheets

OFF-PLANE CONDUCTIVE LINE INTERCONNECTS IN MICROELECTRONIC DEVICES

FIELD

The present description relates to the field of conductive line interconnects formed in microelectronic devices and, in particular to off-plane configurations of such conductive lines.

BACKGROUND

In the structure of silicon wafers and silicon substrates for dies, packaging substrates, fan-out packaging and other devices, metal lines are used inside the silicon structure to connect different devices together. The lines are usually copper but are made from other conductors for specific applications. Typically the lines are arranged in horizontal layers to connect devices at each layer together. To connect devices at different layers, a vertical via that connects two horizontal lines is formed. For devices that are built up in layers by photolithography and similar types of processes common in the construction of silicon micro devices, the horizontal layers are easily formed as the device is built up. Similar approaches are used for micro devices made from other materials.

The metal lines act as wire conductors and are subject to all of the same effects as any other wire conductor. The metal lines will have a resistance, a capacitance, an inductance, and a range of other transient and third order effects. If the metal lines are too close together, then current passing through one line will induce effects in nearby lines through the shared capacitance, inductance and other effects. At high frequencies, cross-talk develops in which a signal in one line generates a similar but weaker signal in the nearby line. Cross-talk and other similar effects are typically avoided and may be reduced by separating the metal lines with insulators and some physical distance. The insulator prevents actual electron flow from one metal line to the other and the physical distance reduces the electromagnetic coupling between the wires so much so that it can be ignored.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

The spacing required to reduce cross-talk reduces the overall density of a die or substrate. The space between metal lines forces the connected devices to have a corresponding spacing which forces the overall devices on the die and similarly the die itself to either be larger or have fewer lines. While cross-talk and other effects can be reduced by carefully placing the metal lines, this limits the placement of other features within the wafer. On the other hand, in embodiments of the present invention nearby parallel lines on the same horizontal layer can be offset vertically. This reduces cross-talk and improves the routing density of the metal lines and also the density other micro devices. The described approach can be used on both Si wafers for interconnects and on wafer level and panel level packaging substrates. The structure and the manufacturing of off-plane metal lines for Si wafers and fan out packaging is described. Similar principles can be applied to connectors for high speed communications interfaces, for interconnect substrates for dies within a package, and for other devices with multiple high-speed conductors.

The cross-talk of nearby parallel lines can be reduced by vertically shifting the adjacent lines off the same horizontal plane. Rather than forming the metal lines on different layers, which interferes with those layers and adds additional processing steps, as described below, the metal lines are shifted with laser ablation. Machining the layer to different depths does not increase the number of process steps or costs. Laser ablation can be performed directly on dielectric build up materials.

Figure 1:
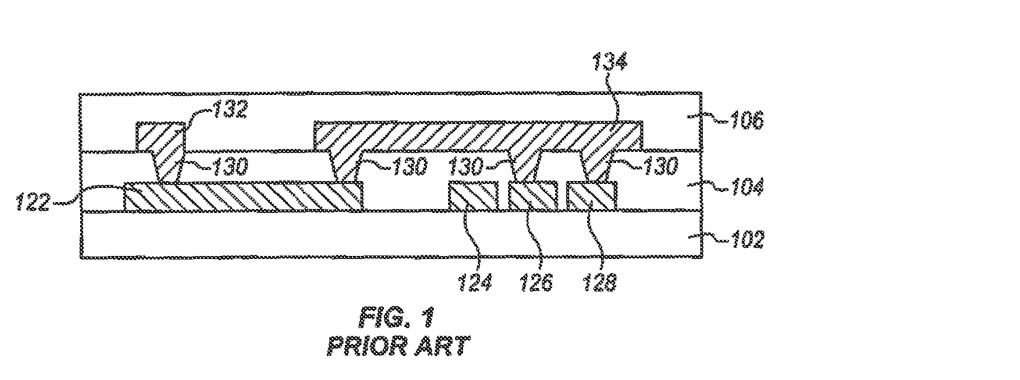
FIG. 1 is a diagram of a conventional cross-section of a substrate with horizontal metal lines connected with vertical vias.

FIG. 1 is a diagram of a cross-section of a substrate with horizontal metal lines connected with vertical vias. The substrate has a base layer 102 upon which a first layer of metal lines 122, 124, 126, 128 has been formed. Typically these lines are formed by applying a second layer of dielectric 104 over the substrate, patterning the dielectric with photoresist, filling in the pattern with copper to form the lines, and then covering the metal lines with more dielectric. However, the metal lines may be formed in any of a variety of other ways, depending on the particular materials and processes used and the intended application of the resulting structure.

As shown, there is a layer of dielectric 104 over the original substrate 102. Vertical vias 130 have been formed through the second layer and filled with copper. A second layer of metal lines 132, 134 is then formed over the middle dielectric layer 104 and a top dielectric layer 106 is formed over the entire structure. There may be many more layers and many more metal lines. The illustrated pattern is provided as an example to understand the principles of the present invention.

As shown in FIG. 1, the horizontal metal lines at each layer are perfectly vertically aligned. The bottom and top surface of each line closely matches that of the neighboring lines at the same level. This maximizes the coupling between lines so that cross-talk is also maximized. This alignment is a natural coincidence of the formation process which has the lines of a layer being formed at the same time using the same process.

Figure 2:
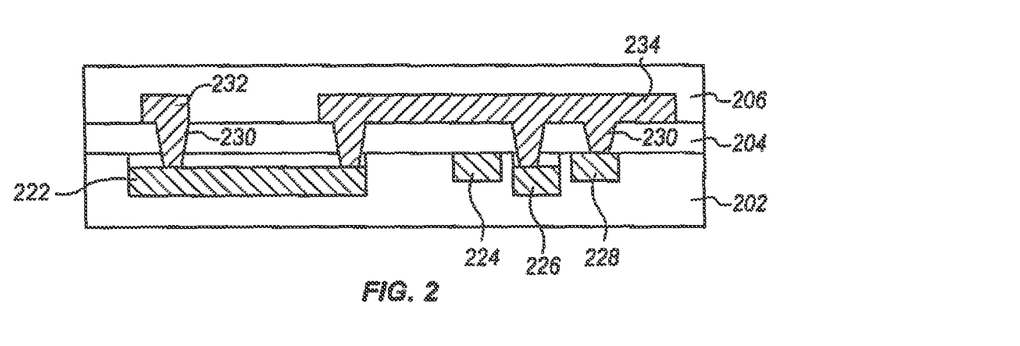
FIG. 2 is a diagram of a cross-section of a substrate with vertically offset horizontal conductive lines connected with vertical vias according to an embodiment of the invention.

In FIG. 2, the lowest horizontal lines in the lowest horizontal layer of patterning are vertically offset in position. The vertical offset alternates within the same horizontal layer so that lines that are next to each other are higher or lower than the next line. In other words, every other line is at the same vertical level. The system in FIG. 2 has the same bottom substrate 202 as in the example of FIG. 1, however, the substrate has been cut away to make a place for some of the horizontal metal lines to be formed at a lower level. There are four metal lines shown. From left to right, at the lowest horizontal layer, the first 222 and third 226 metal lines have been formed in deeper channels than the second 224 and fourth 228 metal lines. As a result, the vertical alignment has been broken. This greatly reduces cross-talk and other effects of coupling between adjacent metal lines in the same horizontal layer.

FIG. 2 also shows that the second dielectric layer 204 has been filled in over the metal layers and then drilled for vertical vias 230. A top horizontal layer of horizontal metal lines 232, 234 has been deposited over the middle dielectric and the whole structure has been covered in a third top dielectric layer 206. Except for the formation and position of the first metal layers, the structure is the same as in FIG. 1.

Figure 3:
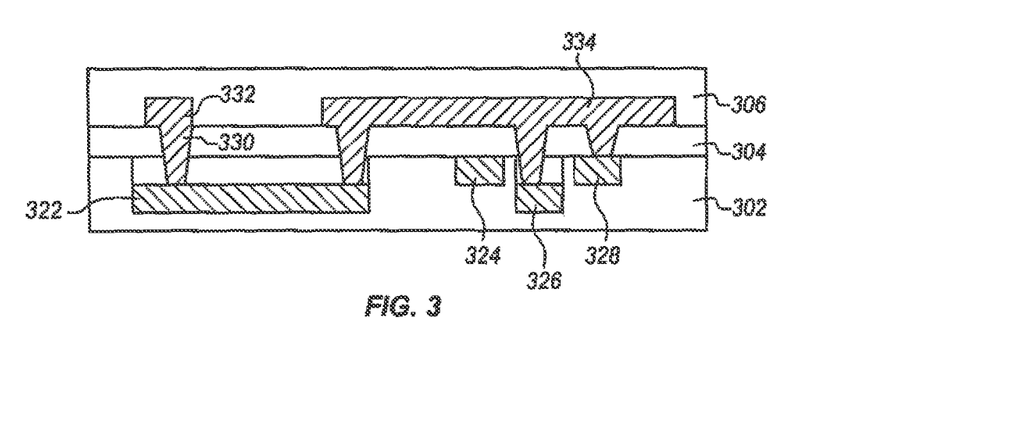
FIG. 3 is a diagram of a cross-section of a substrate with vertically offset horizontal conductive lines with a greater offset than in FIG. 2 connected with vertical vias according to an embodiment of the invention.

FIG. 3 shows an example of applying the approach of FIG. 2 to a greater degree. In FIG. 2, adjacent metal lines, such as 224, 226 are vertically offset by the distance of about one half the height of a horizontal metal line. In FIG. 3, the channels in the bottom substrate 302 have been drilled or ablated deeper and the adjacent metal lines 324, 326 are vertically offset by a distance of about the full height of a horizontal metal line. This can be accomplished simply by drilling or ablating deeper channels in the layer into which the metal lines will be formed. Increasing the offset reduces the coupling between the metal lines through the dielectric. The amount of difference can be much greater than the full height of a metal line, depending on the particular implementation. Compared to the horizontal metal lines, a normal substrate or dielectric layer is much deeper or thicker than shown in the diagram herein so that there is much more room to increase the vertical offset between lines.

As in FIG. 1, the device of FIG. 3 has two dielectric layers 304, 306 over the bottom substrate although in an actual device there may be many more than three layers. The first horizontal layer of metal lines 322, 324, 326, 328 is formed into channels in the substrate. The channels are not the same depth. The depth of the channels for the two deeper metal lines 322, 326 are about twice the depth of the channels for the second 324 and fourth 328 metal lines although they may alternatively be even deeper. The metal lines all have about the same height so that they are not horizontally aligned.

A second level of horizontal metal lines 332, 334 is formed over the second dielectric layer 304 and the two levels are connected with conductive vias 330. A top dielectric layer 306 covers the metal lines and the spaces between the metal lines. While the second higher horizontal layer of metal lines is formed over the second dielectric layer, it may also be formed in channels drilled into that dielectric layer in a manner similar to how the bottom layer is formed.

The techniques shown in FIGS. 2 and 3 can be used not only to reduce cross-talk and related disturbances, but also to increase the density of the metal patterns. In other words by adding a vertical offset, metal lines may be placed closer together horizontally without an increase in noise or a reduction in performance.

Figure 4A:
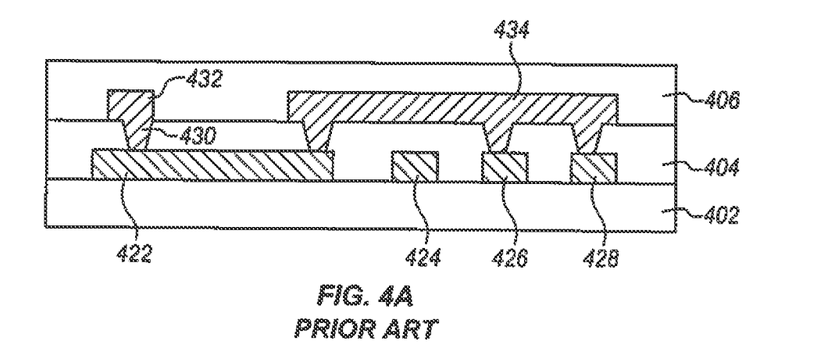
FIG. 4A is a diagram of a conventional cross-section of a substrate with horizontal conductive lines connected with vertical vias.

In FIG. 4A a conventional metal line pattern is shown. FIG. 4A has a base substrate 402 typically of silicon although it may be formed of other materials depending on the particular implementation. A first layer of horizontal metal lines 422, 424, 426, 428 is formed on the base substrate. A second layer 404 is formed over the horizontal lines. Vias 430 are formed in the second dielectric layer 404 and a second layer of horizontal lines 432, 434 is formed over the vias. This is all sealed with a top dielectric layer 406.

As in FIG. 1, the horizontal metal lines at each layer are vertically aligned. They have sidewalls that meet with the sidewalls of adjacent lines through the dielectric that has been formed in between them. In order to reduce cross-talk, they are formed at some distance from each other. This reduces the various coupling effects that cause the problems.

Figure 4B:
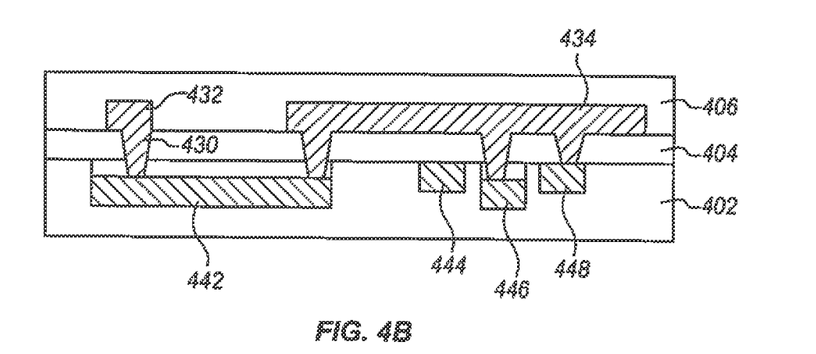
FIG. 4B is a diagram of a cross-section of a substrate with vertically offset horizontal conductive lines used to increase line density and connected with vertical vias according to an embodiment of the invention.

FIG. 4B shows the same structure as FIG. 4A except that the first horizontal layer of metal layers is formed not on the surface of the base substrate 402, but in channels that have been bored, drilled, or ablated into the first substrate. The metal lines are therefore lower and vertically offset. The second 444 and fourth 448 lines are formed into shallower channels than the first 442 and third 446 metal lines. As a result, the second 444 and third 446 metal lines are much closer together in FIG. 4B, than the second 424 and third 426 metal lines of FIG. 4A. Similarly the third 446 and fourth 448 metal lines are much closer together than the third 426 and fourth 428 metal lines of FIG. 4A. Moving the lines closer together allows the total number of lines to be increased or the total size of the device to shrink. This is allowed because the lines are no longer vertically aligned.

Figure 5A:
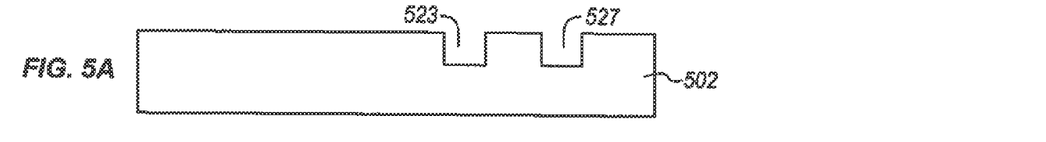
FIGS. 5A to 5G show a process for fabricating a structure such as that of FIGS. 2, 3, and 4 according to an embodiment of the invention.

FIGS. 5A to 5G show a process for fabricating the structure of FIG. 2, 3, or 4B in a sequence of processing operations. In FIG. 5A, the substrate 504 has been etched and laser ablated to form two channels 523, 527. These channels will later receive Cu metal lines. The channels appear very short in this cross-section but may extend into or out of the plane of the page, depending on the particular circuit design. The channels may also be created by various other types of etching and other techniques depending on the materials and their eventual use. A photolithography mask (not shown) may be used to support etching or ablating the channels out of the substrate. The mask is then removed and a second photolithography mask (not shown) is formed over the substrate to allow the deeper channels of FIG. 5B to be formed by etching or ablation. Alternatively, the channels may be formed by laser drilling without using any masks.

Figure 5B:
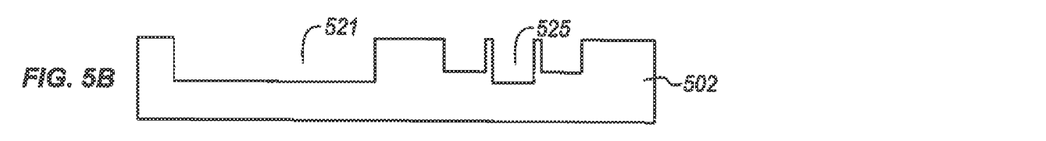

In FIG. 5B, the second mask has been applied and two additional channels 521, 525 are formed at the same horizontal layer. These channels are deeper than the first channels and may be formed in the same way or without a mask by a direct machining technique. As an example the first 523, 527 or second 521, 525 or both sets of channels may be formed by laser drilling.

Figure 5C:
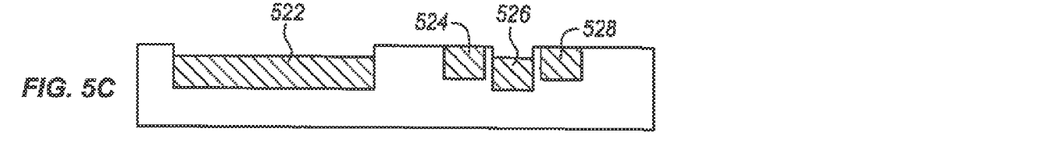

In FIG. 5C a seed layer is applied to each of the channels, using for example chemical vapor deposition. Then a metal layer is formed over the seed layer using electrolytic plating. This metal layer is the basic structure of the horizontal interconnects described above and is typically formed of copper although the invention is not so limited. As shown, the metal layers at this horizontal layer have the same thickness. Because the channels are offset vertically within the same horizontal layer, the bottoms and the tops of adjacent metal layers are offset from each other. This is similar to the offset shown and described, for example, in the context of FIGS. 2 and 3.

Figure 5D:
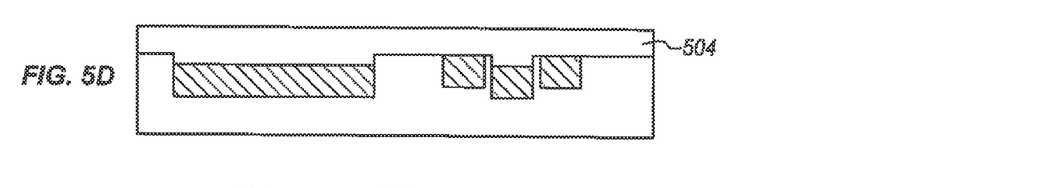
Figure 5E:
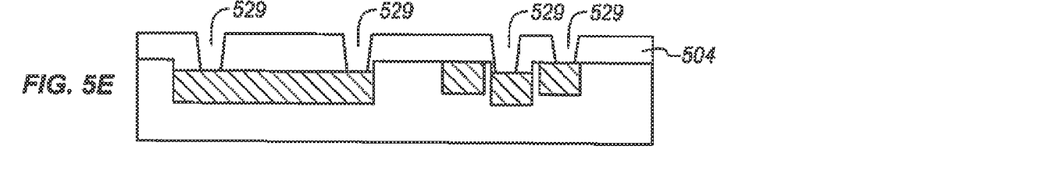
Figure 5F:
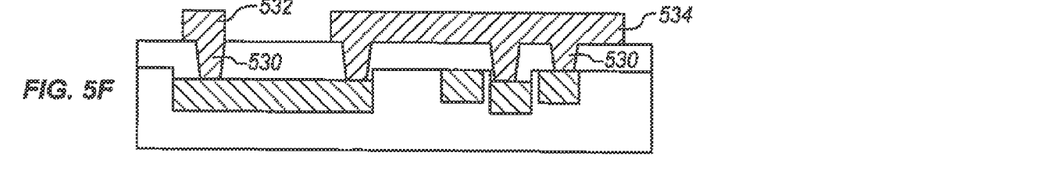

In FIG. 5D a second dielectric layer 504 is built up over the entire surface of the substrate including the copper layers. This is followed in FIG. 5E by drilling or etching openings 529 in the second dielectric layer for vias. In FIG. 5F the Cu vias 530 have been formed in the openings and a second patterned set of lines 532, 534 are applied to the top of the substrate at another horizontal layer to connect the vias as desired. This top layer of lines may be formed in the same way as the bottom layer 522, 524, 526, 528 or in another way. The top layer may have vertical offsets to reduce cross-talk like the bottom layer or it may be all formed in a single layer as shown.

Figure 5G:
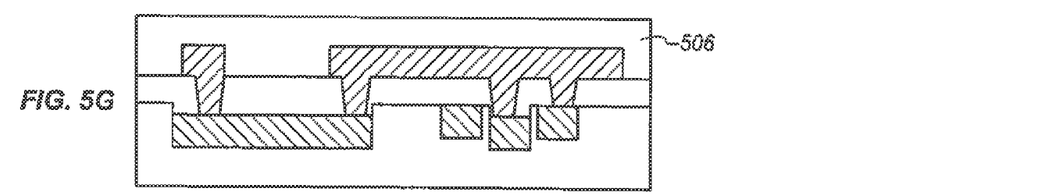

The structure is finished in FIG. 5G with a top dielectric layer 506. This seals the structure and electrically isolates it as well. While only two layers are shown as an example, there may be many more layers, depending on the particular implementation. In addition there may be additional vias to make further connections to other external connectors and components. There may also be many other structures formed in the substrate. These are not shown in order to obscuring the metal lines and their formation in the diagrams.

Figure 6A:
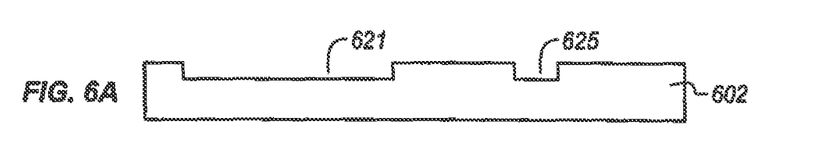
FIGS. 6A to 6F show a process for fabricating a structure such as that of FIGS. 2, 3, and 4 according to another embodiment of the invention.
Figure 6B:
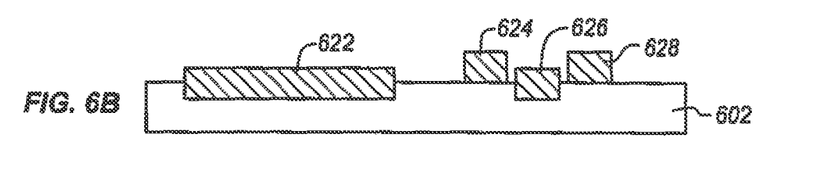

FIG. 6A presents a different example of creating metal lines at different vertical offsets. In the example of FIGS. 6A through 6F a process is shown for fabricating offset metal lines using only one photolithography mask to form the metal lines at two different vertical levels. A substrate 602 has been masked and laser ablated to form deep channels 621, 625. These channels are related to some of the metal lines that will later be deposited on the substrate. As in the other diagrams, the substrate may be silicon, but the invention is not so limited. In FIG. 6B the substrate has been masked (not shown) and a seed layer is deposited in a pattern corresponding to the positions and shapes of the desired metal lines. The metal lines are also deposited and the mask is removed.

In this example, metal lines 622, 626 are formed in the previously formed channels 621, 625 in the substrate 602. However, metal lines 624, 628 are also formed on the surface of the substrate. The metal lines formed on the surface are vertically offset from those formed in the channels in this case by about half the thickness of height of a metal line. The specific amount of vertical offset is determined by the depth of the channels and may be more or less than that shown depending on the desired electrical effects and the thickness of the substrate.

Figure 6C:
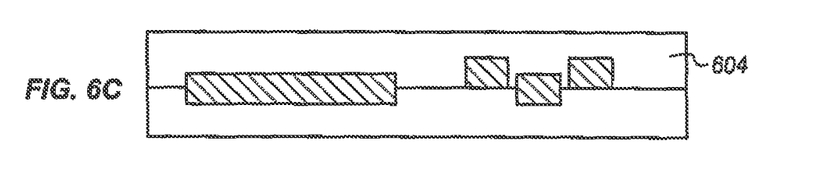
Figure 6D:
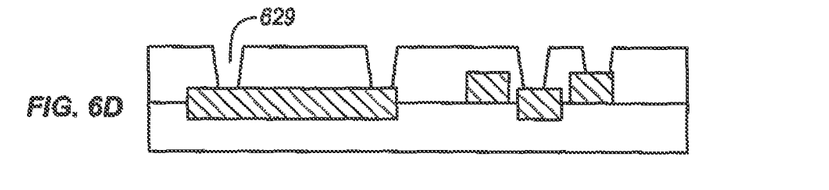
Figure 6E:
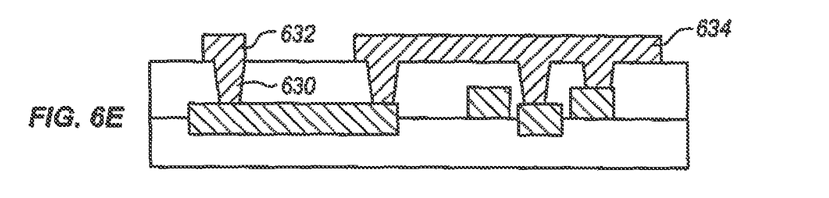
Figure 6F:
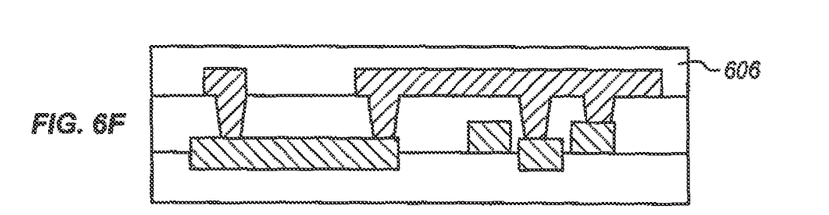

In FIG. 6C a second dielectric layer 604 is built up over the metal lines. In FIG. 6D openings 629 are formed in the second dielectric layer and in FIG. 5D metal vias 630 are formed in the openings. Additional conductive metal lines 632, 634 are applied in FIG. 6E over the second dielectric layer to connect the vias in accordance with the intended design. In FIG. 6F, a top dielectric layer 606 is formed over the second layer of metal lines. As in the example of FIG. 5G, many more layers of lines, vias, dielectrics, and other components may also be formed depending on the particular implementation and intended application of the substrate.

Figure 7A:
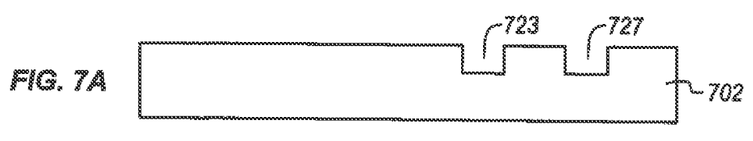
FIGS. 7A to 7E show a process for fabricating a structure such as that of FIGS. 2, 3, and 4 according to a third embodiment of the invention.
Figure 7B:
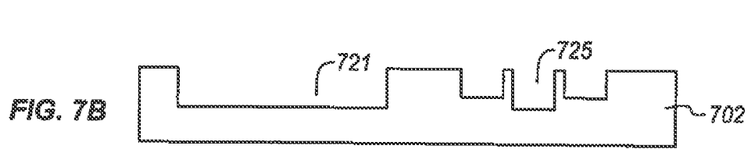
Figure 7C:
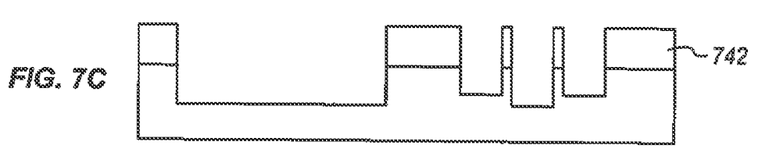
Figure 7D:
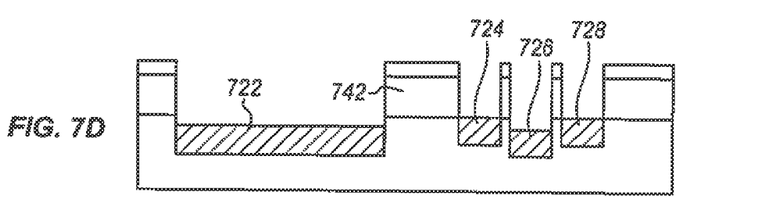

FIG. 7A shows a start of another alternative technique for forming offset metal lines in a substrate. The substrate 702 is masked (not shown) and channels 723, 727 are formed for metal lines. A second mask (not shown) is applied in FIG. 7B and deeper channels 721, 725 are formed by laser ablation or an etching process. In FIG. 7C, a third mask is used to apply a patterned layer of photoresist 742. This patterned layer of photoresist corresponds to the patterns of the metal lines. It exposes the channels but covers the rest of the surface of the substrate 702. As a result in FIG. 7D, the metal lines may be formed by plating the entire surface of the substrate to form metal lines 722, 724, 726, 728 within the channels. Alternatively, the metal lines may be formed by deposition or sputtering.

Figure 7E:
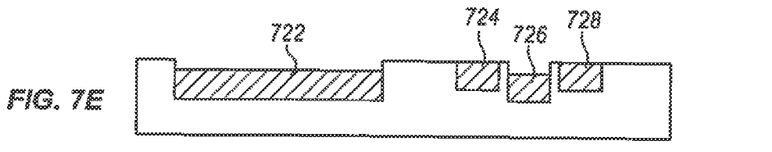

After the metal lines are formed, the photoresist 742 and any excess copper is removed to form a pattern of metal lines with different vertical offsets as shown in FIG. 7E. This structure may be patterned as in the other examples by adding a second dielectric, forming vias in the second dielectric layer, connecting the vias and forming a top dielectric over the entire surface. As with the other examples, the structure may then be encapsulated, packaged, coupled to other substrates or dies or finished in a variety of other ways depending on the particular intended use for the substrate and metal lines.

The vertical offset of the metal lines can be used to improve the bandwidth of the device with less cross-talk. The vertical offsets can also be used to improve the density in the routing of the metal lines. Using laser drilling or a similar technique, lines on the same layer may be formed with vertical offsets without requiring any additional mask and photoresist operations.

Figure 8:
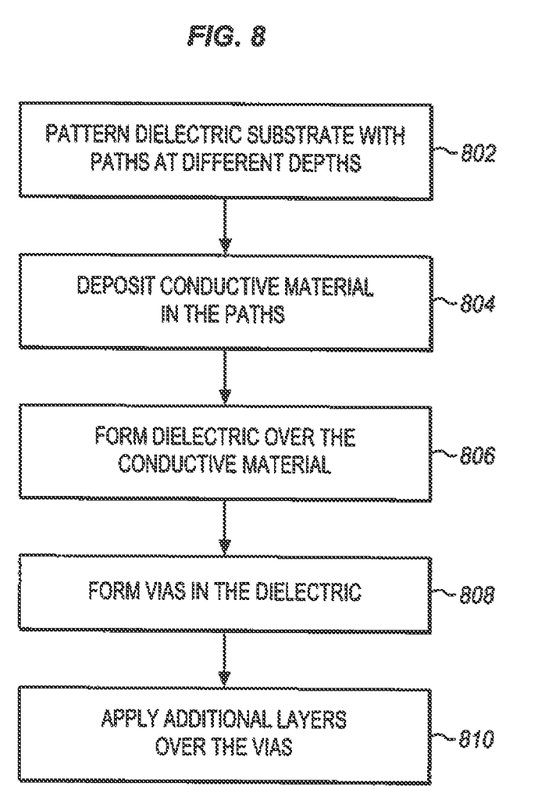
FIG. 8 is a process flow diagram for fabricating a structure such as that of FIGS. 2, 3, and 4 according to an embodiment of the invention

FIG. 8 is a process flow diagram of forming an electronic device with off-plane metal line interconnects. At 802 a dielectric substrate is patterned to form paths in the substrate. The term dielectric substrate is intended to refer to a substrate from the perspective of the deposited conductive material. The substrate may not be the lowest or bottom level of a device and it may not be the base upon which an entire die is fabricated. This process may be applied at any level of a die or device and it may be performed in a device that has no substrate or from which the substrate is later removed. The dielectric substrate as it is referred to herein is a piece of dielectric material with a thickness sufficient to support the metal lines at different widths and a strength great enough to endure the fabrication process.

As described above, the paths are formed at different depths in the substrate. The paths may be formed in any of a variety of different ways. In one example, the paths are formed in a single step by ablation. Each path is independently ablated to the desired depth. In another example, laser drilling is used to form different depths in the substrate without using a photolithography mask. The different depths may also be formed by photolithography using two masks to form the two depths. The different depths may differ by the thickness of the conductive material or the thickness of a metal layer, by half the thickness of a metal layer or by some other amount depending on the desired characteristics of the path.

In another example, the different depths may be created by applying a thin layer of dielectric film on the substrate. The thin layer may be used to partially fill some of the paths or to create the boundaries of paths, or to create entire paths.

At 804, a conductive material, such as copper, is deposited in the paths of the substrate. The conductive material is formed in the paths and so the different depths of the paths create different depths of the conductive material. The different depths of the copper correspond to the different depths of the paths. If the conductive material is deposited to the same thickness, then the top surface in each path will be offset by the same amount as the bottom surface in each path. The conductive material is typically a metal, such as copper, however other conductive materials may be used, depending on the desired properties. The metal lines may be formed in a variety of different ways, such as chemical vapor deposition or sputtering. In one example, a seed layer is deposited in the paths of the substrate by chemical vapor deposition or in some other way. Then a conductive material is deposited over the seed layer by electrolytic plating. The conductive material may be deposited at different depths with the same thickness in a single step.

At 806, a dielectric is formed over the deposited conductive material. The dielectric can isolate the metal lines from each other and also isolate the metal lines at this first horizontal level or layer from any later deposited metal lines at another horizontal level. This dielectric material may be of the same material as the original substrate or another material.

At 808 vias are formed to connect the conductive material with a pattern at some higher horizontal layer and at 810 additional layers are applied over the vias. The vias can be formed by drilling and filling or by photolithography processes. The additional layers may include one or more layers of in-plane or off-plane metal lines that are connected to the first layer or other layers by the vias or by additional vias formed later. There may be various devices formed between the layers of metal lines and the vias. The additional layers may also include top dielectrics, connection pads, and other layers, depending on the intended use for the device.

Figure 9:
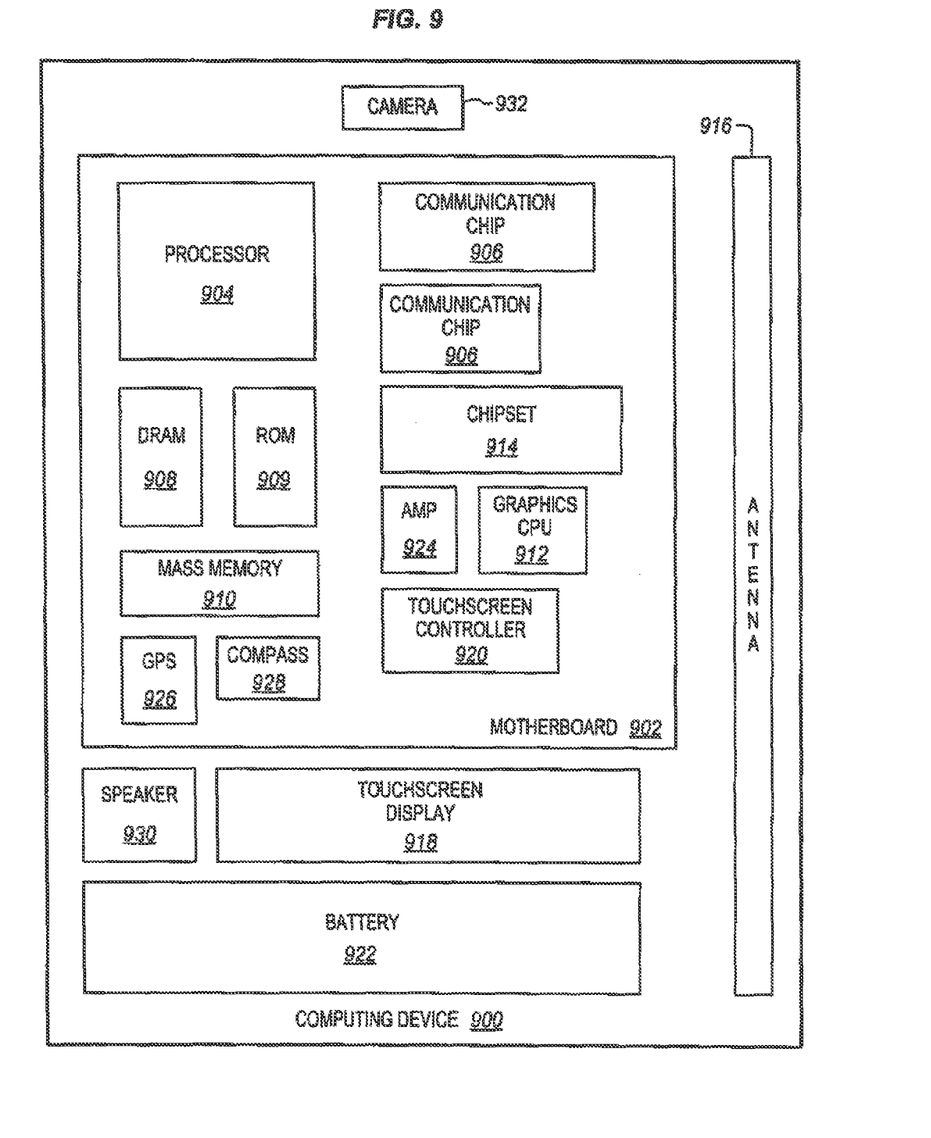
FIG. 9 is a block diagram of a computing device containing dies with off-plane conductive lines according to an embodiment of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM) 908, non-volatile memory (e.g., ROM) 909, flash memory (not shown), a graphics processor 912, a digital signal processor (not shown), a crypto processor (not shown), a chipset 914, an antenna 916, a display 918 such as a touchscreen display, a touchscreen controller 920, a battery 922, an audio codec (not shown), a video codec (not shown), a power amplifier 924, a global positioning system (GPS) device 926, a compass 928, an accelerometer (not shown), a gyroscope (not shown), a speaker 930, a camera 932, and a mass storage device (such as hard disk drive) 910, compact disk (CD) (not shown), digital versatile disk (DVD) (not shown), and so forth). These components may be connected to the system board 902, mounted to the system board, or combined with any of the other components.

The communication chip 906 enables wireless and/or wired communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor, memory devices, communication devices, or other components include one or more dies that are formed with off-plane conductive line interconnects in accordance with implementations of the invention. The term "processor" may refer to any device or portion of a device that processes electronic data from registers and/or memory to transform that electronic data into other electronic data that may be stored in registers and/or memory.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

In one embodiment an apparatus comprises a dielectric substrate, a first set of metal conductive lines in the substrate at a first horizontal layer of the substrate, and a second set of metal conductive lines in the substrate at the first horizontal layer of the substrate and vertically offset from the first set of metal lines. A dielectric material insulates the metal lines from each other and the first horizontal layer from other horizontal layers; and vias in the dielectric material connect both the first and second set of metal lines to metal lines at a second horizontal layer of the substrate.

In further embodiments, the first set of metal lines is vertically offset from the second set of metal lines by half the thickness of the first set of metal lines. The first set of metal lines may also be vertically offset from the second set of metal lines by the thickness of the first set of metal lines. The first set of metal lines may also alternate in horizontal position with the second set of metal lines. Further embodiments include a third set of metal conductive lines at a second horizontal layer to connect at least a portion of the vias with a horizontal pattern. In further embodiments, the nearby horizontal distance of metal lines from first and second sets are placed closer to less than half of the line pitch.

In another embodiment, a communications device comprises a die having electronic circuitry formed in a dielectric substrate, a first set of metal conductive lines in the substrate at a first horizontal layer of the substrate, and a second set of metal conductive lines in the substrate at the first horizontal layer of the substrate and vertically offset from the first set of metal lines. A dielectric material insulates the metal lines from each other and the first horizontal layer from other horizontal layers and vias in the dielectric material connect both the first and second set of metal lines to metal lines at a second horizontal layer of the substrate.

In further embodiments, a third set of metal conductive lines at a second horizontal layer connects at least a portion of the vias with a horizontal pattern. The nearby horizontal distance of metal lines from first and second sets may be placed closer to less than half of the line pitch.

In another embodiment, a method comprises patterning a dielectric substrate to form a plurality of paths in the substrate, the paths being formed at different depths in the substrate, depositing a conductive material in the paths of the substrate, the conductive material being formed at different depths of the substrate corresponding to the different depths of the paths, forming dielectric over the conductive material, forming vias to connect the conductive material with a pattern, and applying additional layers over the vias.

In further embodiments, the patterning is by ablation or laser drilling to form different depths in the substrate. The different depths may be depths that are different by the thickness of the conductive material. In further embodiments, a seed layer is deposited in the paths of the substrate and the conductive material is deposited over the seed layer by electrolytic plating. In further embodiments, patterning is with a thin layer of dielectric film on the substrate. Depositing may also be at different depths with the same thickness in a single step.

What is claimed is:

1. An apparatus comprising:
a dielectric substrate;
a first set of metal conductive lines in the substrate at a first horizontal layer of the substrate;
a second set of metal conductive lines in the substrate at the first horizontal layer of the substrate and vertically offset from the first set of metal lines;
a second horizontal layer of dielectric material over the first horizontal layer and over the first and second sets of metal lines;
a third set of metal lines directly over the second horizontal layer, wherein the second horizontal dielectric material layer insulates the metal lines from each other and the first horizontal layer from other horizontal layers; and
vias in the second horizontal layer of dielectric material to connect both the first and second set of metal lines to the third set of metal.

2. The apparatus of claim 1, wherein the first set of metal lines is vertically offset from the second set of metal lines by half the thickness of the first set of metal lines.

3. The apparatus of claim 1, wherein the first set of metal lines is vertically offset from the second set of metal lines by the thickness of the first set of metal lines.

4. The apparatus of claim 1, wherein the first set of metal lines alternate in horizontal position with the second set of metal lines.

5. The apparatus of claim 1, wherein the nearby horizontal distance of metal lines from first and second sets are placed closer to less than half of the line pitch.

6. The apparatus of claim 1, further comprising a third horizontal layer of dielectric material over the second layer and the third set of metal lines.

7. A communications device comprising:
a die having electronic circuitry formed in a dielectric substrate;
a first set of metal conductive lines in the substrate at a first horizontal layer of the substrate;
a second set of metal conductive lines in the substrate at the first horizontal layer of the substrate and vertically offset from the first set of metal lines;
a dielectric material at a second horizontal layer insulating the metal lines from each other and the first horizontal layer from other horizontal layers;
a third set of metal lines in a third horizontal layer directly over the second horizontal layer; and
vias in the dielectric material to connect both the first and second set of metal lines to the third set of metal lines.

8. The communications device of claim 7, further comprising a third horizontal layer of dielectric material over the second layer and the third set of metal lines.

9. The communications device of claim 7, wherein the nearby horizontal distance of metal lines from first and second sets are placed closer to less than half of the line pitch.

10. A method comprising:
patterning a first silicon substrate layer to form a plurality of grooves in the substrate, the grooves being formed below the top of the substrate;
depositing a conductive material in the grooves of the substrate, the conductive material being formed at different depths of the substrate corresponding to the different depths of the paths to form a first set of metal lines;
depositing a conductive material over the top of the first substrate layer to form a second set of metal lines
forming a second silicon layer over the first silicon substrate layer and over the conductive material;
depositing a third set of metal lines directly over the second silicon layer;
forming vias through the second silicon layer to connect the first set of metal lines with the third set of meta lines; and
applying additional silcon layers over the vias.

11. The method of claim 10, wherein patterning comprises patterning by ablation to form different depths in the substrate.

12. The method of claim 10, wherein patterning comprises patterning by laser drilling to form different depths in the substrate without using a photolithography mask.

13. The method of claim 10, wherein forming at different depths comprises forming at depths that are different by the thickness of the conductive material.

14. The method of claim 10, further comprising depositing a seed layer in the paths of the substrate and wherein depositing the conductive material comprises depositing a conductive material over the seed layer by electrolytic plating.

15. The method of claim 10, wherein patterning comprises patterning with a thin layer of dielectric film on the substrate.

16. The method of claim 10, wherein depositing the conductive material comprises depositing the conductive material at different depths with the same thickness in a single step.

* * * * *